US006043978A

United States Patent [19]

Mody et al.

[11] Patent Number: 6,043,978

[45] Date of Patent: Mar. 28, 2000

[54] COOLING DEVICE FOR CIRCUIT BREAKERS

[75] Inventors: Hemant K. Mody, Brookfield; Xin Zhou, Glendale; Peter J. Theisen, West Bend, all of Wis.

[73] Assignee: Eaton Corporation, Cleveland, Ohio

[21] Appl. No.: 08/990,249

[22] Filed: Dec. 15, 1997

[51] Int. Cl.[7] .................................................. H05K 7/20

[52] U.S. Cl. ......................... 361/690; 361/673; 361/676; 361/678; 361/694; 165/80.3; 165/185; 310/25

[58] Field of Search .................................. 361/673, 689, 361/690, 694, 695, 698, 699; 165/122, 185; 417/436, 410.1; 415/125; 310/25

[56] References Cited

U.S. PATENT DOCUMENTS

| | | | |
|---|---|---|---|
| 4,063,826 | 12/1977 | Riepe | 417/436 |
| 4,498,851 | 2/1985 | Kolm et al. | 417/410.1 |
| 4,780,062 | 10/1988 | Yamada et al. | 417/410.1 |
| 4,834,619 | 5/1989 | Walton | 417/53 |
| 4,923,000 | 5/1990 | Nelson | 165/122 |
| 5,104,626 | 4/1992 | Yang | 417/436 |
| 5,522,712 | 6/1996 | Winn | 417/436 |

*Primary Examiner*—Leo P. Picard
*Assistant Examiner*—Boris L. Chervinsky
*Attorney, Agent, or Firm*—Martin J. Moran

[57] ABSTRACT

An alternating current circuit breaker having an extended fin cantilevered from its housing. A portion of the fin along its extended length is magnetized so that the fin flutters in the magnetic field generated by the alternating current conducted through the breaker. The resulting magnetic resonance vibration establishes forced, convective heat transfer which assists cooling of the breaker.

18 Claims, 3 Drawing Sheets

COOLING DEVICE FOR CIRCUIT BREAKERS

BACKGROUND OF THE INVENTION

1. Field of the Invention

This invention relates generally, to fluid distribution systems and has application, among other uses, to power distribution and control equipment. The invention provides particular benefit in an application to medium and high current circuit interrupters and, more particularly, to compact medium and high current circuit breakers.

2. Background Information

Joule heating along the current path in a circuit breaker is one of the major factors that limits size reduction and load upgrading. Temperature rise at the circuit breaker terminals is regulated according to the cable installation requirements as set in industrial standards. The temperature rise inside medium current circuit breakers is limited by case materials as well as trip units. Due to the nature of medium current circuit breakers, heat transfer between the circuit breakers and their environment is very limited. Typically, heat is transferred out of the circuit breakers by heat conduction through the terminal cables (or bus bars) and natural convection through the circuit breaker cases. This limits the reduction of temperature rise within the cases and, therefore, the current load upgrading ability. Heat transfer is particularly a problem with molded case circuit breakers. While the molded case material is an excellent electrical insulator, it is also an effective thermal insulator.

Accordingly, an improved circuit breaker is desired that provides enhanced heat transfer from its contacts and terminals to the surroundings and environment.

SUMMARY OF THE INVENTION

In one embodiment this invention establishes forced convective heat transfer at the terminals of the circuit interrupter by applying a magnetically driven resonance vibration cooling device. The device has an extended fin cantilevered from the circuit breaker housing with a portion of its extended length magnetized (or constructed from a material that will be so influenced by the magnetic field), so that it flutters when exposed to the magnetic field set up by the alternating current flowing through the breaker. The fluttering or vibrating fin creates air movement within the terminal cavity that enhances heat transfer to the surroundings.

In a broader sense this invention can function as a fluid distribution system in most environments in which an alternating magnetic field can be generated. The invention can also establish fluid distribution within any housing permeable to an electromagnetic field, in which the oscillating member or fin can be suspended, without requiring penetration of the housing. It is also contemplated that this invention can be placed inside a circuit interrupter to create air movement within the casing.

These and other objects, features, and advantages of the present invention, will become apparent to those skilled in the art upon a reading of the following description when taken in conjunction with the drawings wherein there is shown and described illustrative embodiments of the invention.

BRIEF DESCRIPTION OF THE DRAWINGS

While the specification concludes with claims specifically pointing out and distinctly claiming the subject matter of the invention, it is believed that the invention will be better understood from the following description, taken in conjunction with the accompanying drawings wherein:

DESCRIPTION OF THE PREFERRED EMBODIMENT

Since the majority of current generated heat is conducted away from circuit breakers through terminal cables (or bus bars), any forced convection heat transfer at the terminals and inside circuit breaker housings with vents will change the heat flow pattern and increase the heat transfer between the circuit breaker and its environment. Forced convective heat transfer can be achieved in accordance with this invention by applying a magnetically driven resonance vibration cooling device.

Figure 1:
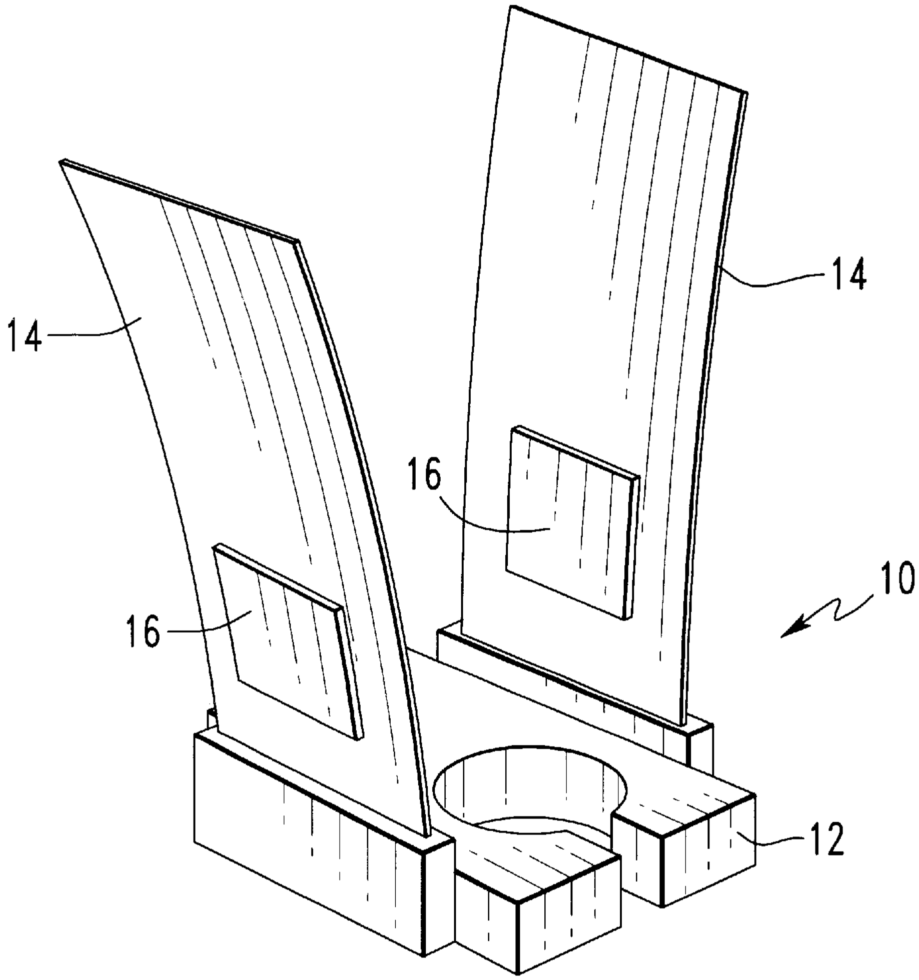
FIG. 1 is an isometric view of a portion of a circuit breaker housing incorporating the features of this invention.
Figure 2:
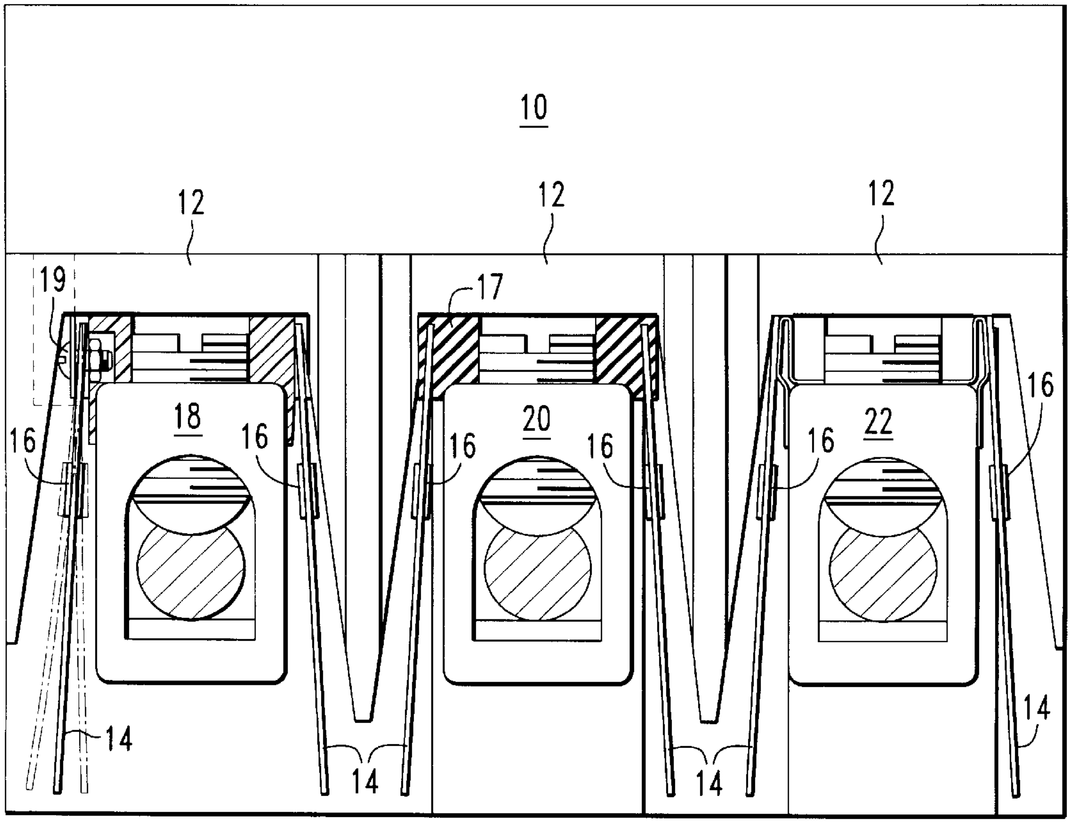
FIG. 2 is a schematic view of the circuit breaker housing illustrating terminals incorporating fins of this invention on either side.

A portion of a circuit breaker constructed in accordance with this invention is illustrated in FIG. 1 and shown in more detail in FIG. 2. In accordance with this invention, fins 14 are supported from the circuit breaker housing 10 on either side of the terminal blocks 12. Preferably, the fins 14 are constructed from plastic reeds that have permanent magnets 16 affixed to their surface at a location spaced from the housing 10. Though plastic is preferred, it should be appreciated that other flexible materials can be employed. For example, the reeds can be manufactured from relatively thin ferro-magnetic strips of metal such as spring steel. If steel is employed, the permanent magnet is not required, and the resonance frequency will be twice that of the alternating current frequency. The reeds are clamped to the housing at their base and extend outward in a cantilevered fashion. Each plastic reed is designed and a permanent magnet 16 is mounted on the reed in such a way that resonance vibration of the reed is established by the force on the magnet induced by the alternating magnetic field generated from the electrical current carrying members of the circuit breaker.

FIG. 2 illustrates three different methods for affixing the reeds 14 to the base of the terminal blocks 12. The fins adjacent terminal block 18 are clamped by screws 19. The fins adjacent to terminal block 20 are crimped into position, while the fins adjacent to terminal block 22 are shown clamped in a key-lock design. The preferred arrangement from a manufacturing cost perspective is the crimped design shown on either side of terminal block 20.

Figure 3:
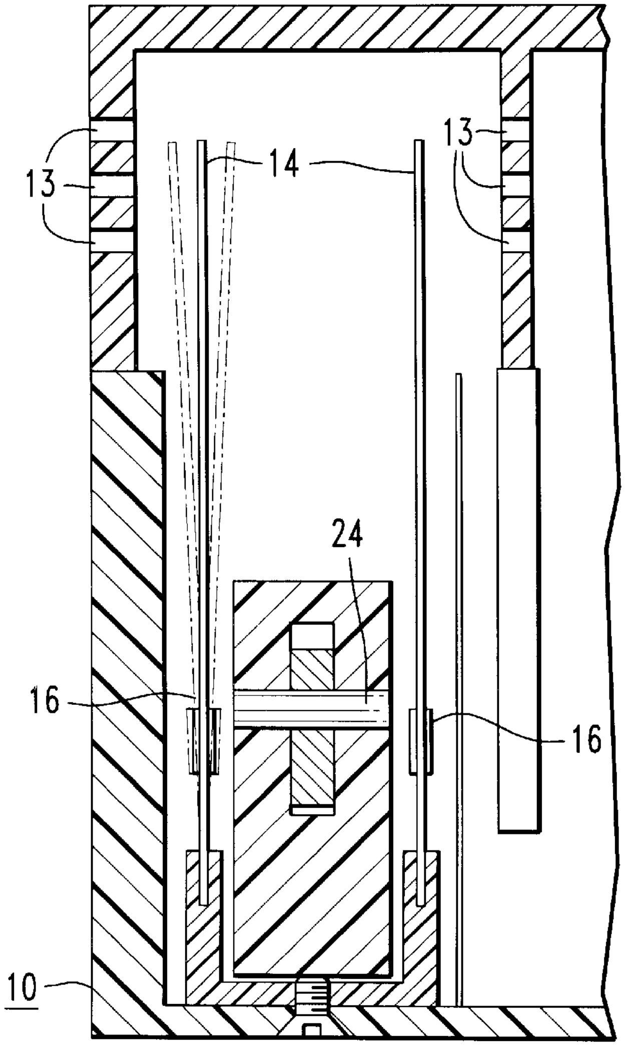
FIG. 3 is a cross section of a circuit breaker housing at the contact location showing fins of this invention supported on either side of the contact arm.

FIG. 3 shows the fins 14 of this invention applied to a location adjacent the circuit breaker contacts 24 within the housing 10, and illustrates that the features of this invention can be applied to each of the resistance heat generating locations within the circuit breaker housing. Thus, as the current goes through the housing, the alternating magnetic field induced by the current drives the reeds in alternating directions causing them to vibrate and, thus, enhances forced convection which improves the cooling capability of the circuit breaker. The resulting enhanced heat transfer enables the load rating of the breaker to be upgraded or the size of the breaker reduced. Forced convection can be further enhanced by providing vents 13 in the circuit breaker housing shown in FIG. 3.

Tests have been conducted to measure the effects of the magnetic resonance vibration by measuring temperatures at the circuit breaker terminals and contact arms. In a test of one basic circuit breaker embodiment, the test data showed a 9% decrease of temperature rise at the terminals and approximately a 6% decrease of temperature rise at the contact arms. Enhanced designs are expected to provide even better results.

The cooling effects of the magnetically driven reeds can be further enhanced by optimizing air flow through further improvements in (i) the design of the reed, (ii) how the reed is attached to the housing, and (iii) the shape of the housing enclosing the area to be cooled. For example, the cross section of the reed, its profile, and the location of the permanent magnet may be varied to maximize airflow.

More particularly, for example, several factors have to be considered in the design of magnetic driven resonance vibration cooling device. First, the reed has to be designed so resonance vibration can be obtained; Second, the cooling device has to be designed and positioned in its surrounding environment in such a way so the permanent magnets can experience the highest magnetic force possible and maximum air flow can be induced by the resonance vibration. The following calculations are illustrative of a process that can be employed to guide the optimization of the design of the composite vibrating member in conjunction with a repetitive testing program.

Analytical Calculation of Reed Geometry

Figure 4:
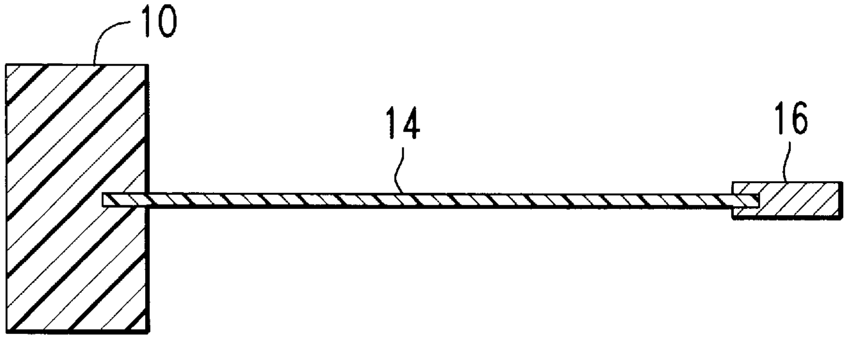
FIG. 4 is a schematic diagram of a cantilevered member.

For a cantilever as shown in the following FIG. 4, the natural frequency ω can be expressed as:

$$\omega = \sqrt{\frac{k}{M + 0.23m}}$$

where k is the stiffness of the blade, m is the mass of the blade, and M is the end mass at the top of the blade. k can be expressed in the following equation:

$$k = \frac{3EI}{l^3}$$

where E is the modulus of elasticity, $$I = \frac{1}{12}bh^3$$

is the momentum of inertia, l is the length of the blade, b is the width of the blade, and h is the thickness of the blade. The mass m of the blade is equal to ρbhl and ρ is the density of the material.

Therefore, the final expression can be written as follows:

$$120\pi = \sqrt{\frac{Ebh^3}{4l^3(M + 0.23\rho bhl)}}$$

An example for unfilled polyester blade:

$E=1.38\times10^9$ pa, $b=1.27\times10^{-2}$ m, $h=5.08\times10^{-4}$ m, ρ=885.8 kg/$m3$ then the blade length should be:

l=1.73 cm=0.68 in (M=753.1 mg, magnet size=0.05"×0.325"×0.325")

l=2.46 cm=0.97 in (M=240.6 mg, magnet size=0.05"×0.20"×0.20")

If the magnet is removed from the tip of the blade, the length of the blade should be:

l=4.19 cm=1.65 in (M=0.0 mg)

In reality, blades usually are longer than one inch and permanent magnets are attached close to the fixed ends of blades. So this calculation has to be modified to take into consideration the extra portion of blades extended beyond the permanent magnets.

Analytical Calculation of Magnetic Force on Permanent Magnets

The magnetic force can be estimated according to the following energy equation:

$$F \cdot \Delta D = \frac{\mu_0}{2}\int_V \Delta H^2 \, dV$$

where F is the magnetic force, ΔD is the displacement of the permanent magnet $\mu$ is the permeability of free space, V is the space volume, dV is the finite space volume, and H is the magnetic intensity.

The magnetic intensity induced by the current carrying member can be calculated by the equation:

$$H = H_I \cdot \sin(\omega t) = \begin{cases} \dfrac{I \cdot \sin(\omega t)}{2\pi a^2} r & r < a \\ \dfrac{I \cdot \sin(\omega t)}{2\pi r} & r \geq a \end{cases}$$

where I is the current, ω is the frequency, and a is the current carrying member radius.

The permanent magnets are treated as magnetic dipoles here. The magnetic intensity of the permanent magnet can be estimated by the following set of equations:

$$H_{mx} = \frac{3m}{4\pi} \cdot \frac{(x - x_0)(y - y_0)}{R^5}$$

$$H_{my} = \frac{m}{4\pi} \cdot \frac{1}{R^3}\left[\frac{3(y - y_0)^2}{R^2} - 1\right] \cdot \begin{cases} 1 & R \geq al \\ \dfrac{1}{\left[1 + \left(\dfrac{al}{R}\right)^{\frac{3}{2}}\right]^{\frac{3}{2}}} & R < al \end{cases}$$

$$H_{mz} - \frac{3m}{4\pi} \cdot \frac{(y - y_0)(z - z_0)}{R^5}$$

$$R = \sqrt{(x - x_0)^2 + (y - y_0)^2 + (z - z_0)^2}$$

m is the magnetic moment, and al is the equivalent loop radius.

Therefore, the total magnetic field intensity should be:

$$H_{tx} = H_{mx} + H_{Ix} \cdot \sin(\omega t)$$

$$H_{ty} = H_{my} + H_{Iy} \cdot \sin(\omega t)$$

$$H_{tz} = H_{mz} + H_{Iz} \cdot \sin(\omega t)$$

Finally, the force can be written in the format as follows:

In this equation, the first term at the right hand side represents the force between the two permanent magnets and the second term is the force on the permanent magnet from $$F = \frac{\mu_0}{2 \cdot \Delta D} \int_V (A + B \cdot \sin(\omega t)) \cdot dV = \frac{\mu_0}{2 \cdot \Delta D} \sum_V (A_i + B_i \cdot \sin(\omega t)) \cdot \Delta V_i = C_0 + C_l \cdot \sin(\omega t)$$

the load current.

Figure 5:
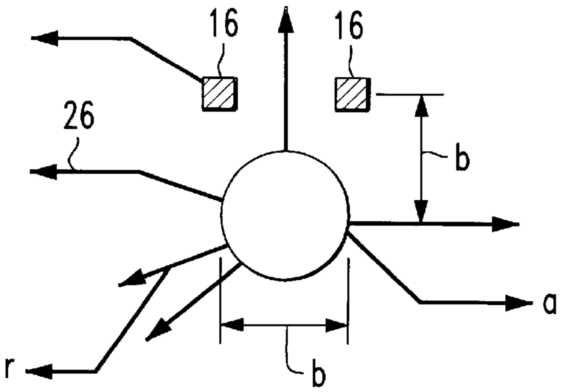
FIG. 5 is a schematic diagram of a permanent magnet and current carrying member arrangement.

With reference to FIG. 5, where reference character 26 represents the current carrying conductor for a 1" diameter conductor carrying 220 Amperes and having two Samarium Cobalt magnets 0.157" thick, placed 1" apart and 0.5" from the center of the conductor, the force on the magnets due to the current was calculated to be 10 mN. The force between the magnets was calculated to be 1 N.

This calculation allows us to optimize the location of the permanent magnets in order to obtain the best results of resonance vibration. It is to be used as a guideline in connection with numerical simulation and normal testing to establish the right combination of amplitude, placement and vibration modes of the oscillating member that maximizes air flow.

While these equations are helpful in narrowing down the design choices, final optimization is carried out using a combination of well known numerical (finite element analysis) and experimental techniques. The equations give a starting part that can be then further refined by the foregoing analytical and experimental analysis.

Accordingly, this invention is effective to increase forced convective heat transfer, to reduce temperature rise within the breaker without requiring extra power. The reeds provide a minimum of vibration noise due to the use of plastic platforms with permanent magnets and vibration at the power line frequency. Thus employing this invention, a circuit breaker of a given rating can be more compact or, alternatively, upgraded.

While the preferred embodiment has illustrated the application of this invention to the terminals and contacts of a circuit breaker, it should be appreciated that the benefits of the invention can be realized when applied along the alternating circuit path of various types of circuit interrupters including vacuum interrupters, contactors, switches, and other current regulating, distribution, control and utilization devices. The invention is particularly beneficial to molded circuit breaker applications due to the high thermal resistance of the casing materials.

In addition to power distribution applications, this invention can be used to distribute or mix fluids that are permeable to an alternating electromagnetic field that are capable of having the oscillating member suspended within it, e.g., hazardous waste storage tanks. It has particular benefit when applied to a sealed housing that is also permeable to an alternating electromagnetic field, e.g., a pressure vessel, because the benefits of the invention can be achieved without breaching the integrity of the housing.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. An electrical apparatus employing alternating current to flow through or within close proximity to the apparatus for a first purpose, the apparatus including a cooling mechanism comprising a flexible reed having an elongated length with a first end anchored to the electrical apparatus and a second end cantilevered from the first end with a portion of the elongated length substantially adjacent the second end, as compared to the spacing of the portion from the first end, constructed of a material that is influenced by a magnetic field set up by the alternating current to cause excitation of the reed at or near its resonant frequency with the alternating current influencing excitation of the reed flowing through the electrical apparatus substantially adjacent the first end relative the spacing of the flow of electrical current from the second end, without diverting any of the alternating electrical current from the first purpose.

2. The electrical apparatus of claim 1, wherein the material is ferro-magnetic.

3. The electrical apparatus of claim 1, wherein at least the portion of the flexible reed is permanently magnetized.

4. The electrical apparatus of claim 3, wherein the permanent magnet is positioned at a point along an extended length of the reed which substantially coincides with the location along the reed that the magnet field is the strongest.

5. The electrical apparatus of claim 1, wherein the electrical apparatus is a circuit interrupter.

6. The electrical apparatus of claim 5, wherein the flexible reed is fastened within the proximity to one side of a terminal of the circuit interrupter.

7. The electrical apparatus of claim 6, including a second flexible reed wherein the first and second flexible reeds are respectively anchored within proximity to opposite sides of the terminal of the circuit interrupter.

8. The electrical apparatus of claim 5, wherein the circuit interrupter has a housing, including vents in the housing in proximity to the position of the reed.

9. The electrical apparatus of claim 8, wherein the vents in the housing are aligned with the direction of movement of the reed.

10. The electrical apparatus of claim 5, wherein the flexible reed is fastened within proximity to one side of a contact arm of the circuit interrupter.

11. The electrical apparatus of claim 1, wherein the reed is substantially constructed out of plastic.

12. A circuit interrupter adapted to have an alternating current flow there through, the circuit interrupter including a cooling mechanism comprising a first flexible reed having an elongated length with a first end anchored to the electrical apparatus and a second end cantilevered from the first end with a portion of the elongated length substantially adjacent the second end, as compared to the spacing of the portion from the first end, magnetized and cantilevered within and excited by a magnetic field generated by the alternating current passing through the circuit interrupter at a location substantially adjacent the first end relative the spacing of the flow of the electrical current from the second end, without diverting any of the electrical current flowing through the circuit interrupter.

13. The circuit interrupter of claim 12, wherein the flexible reed is anchored at a location within proximity to an electrical conductor within the circuit interrupter.

14. The circuit interrupter of claim 13, including a second flexible reed wherein the first and second flexible reeds are respectively anchored within proximity to and on opposite sides of the electrical conductor.

15. The circuit interrupter of claim 12, including a housing comprising a molded plastic case.

16. The circuit interrupter of claim 15, including vents in the housing which are aligned with the movement of the reeds.

17. The circuit interrupter of claim 12, wherein the cross-section of the reed is varied along at least one portion of its length.

18. A method of cooling an apparatus having an alternating current flowing there through for a first purpose comprising the steps of:

Supporting a first end of an oscillating member within the apparatus secured to the apparatus and having an extended length with a second end of the oscillating member cantilevered from the first end and having a portion constructed of a material that is influenced by a magnetic field set up by the alternating current to cause excitation of the member at or near its resonant frequency with the alternating current influencing excitation of the oscillating member flowing through the electrical apparatus substantially adjacent the first end relative to the spacing of the flow of electrical current from the second end and without diverting any of the alternating current from the first purpose, wherein the portion is suspended within the field; and Supplying the alternating current to create the magnetic field.

* * * * *